United States Patent
Mutyala et al.

(10) Patent No.: US 11,929,278 B2
(45) Date of Patent: Mar. 12, 2024

(54) LOW IMPEDANCE CURRENT PATH FOR EDGE NON-UNIFORMITY TUNING

(71) Applicant: Applied Materials, Inc., Santa Clara, CA (US)

(72) Inventors: Madhu Santosh Kumar Mutyala, Santa Clara, CA (US); Saketh Pemmasani, Telangana (IN); Akshay Dhanakshirur, Hubli (IN); Mayur Govind Kulkarni, Bangalore (IN); Hang Yu, San Jose, CA (US); Deenesh Padhi, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 356 days.

(21) Appl. No.: 17/324,495

(22) Filed: May 19, 2021

(65) Prior Publication Data

US 2022/0375776 A1    Nov. 24, 2022

(51) Int. Cl.
    *H01L 21/683*  (2006.01)
    *C23C 16/458*  (2006.01)
    *H01J 37/32*   (2006.01)

(52) U.S. Cl.
    CPC ...... *H01L 21/6833* (2013.01); *C23C 16/4583* (2013.01); *H01J 37/32724* (2013.01); *H01J 37/32091* (2013.01); *H01J 37/32899* (2013.01); *H01J 2237/2007* (2013.01); *H01J 2237/332* (2013.01)

(58) Field of Classification Search
    CPC ........... H01L 21/6833; H01L 21/67167; H01L 21/6875; C23C 16/4583; C23C 16/4581; C23C 16/4586; C23C 16/46; H01J 37/32724; H01J 37/32091; H01J 37/32899; H01J 2237/2007; H01J 2237/332
    See application file for complete search history.

(56) References Cited

U.S. PATENT DOCUMENTS 10,714,370 B2    7/2020  Tomioka et al.
2021/0384060 A1*  12/2021 Hayashi ............ H01J 37/32807

FOREIGN PATENT DOCUMENTS

| JP | 2010-135851 A | 6/2010 |
| JP | 2017-191949 A | 10/2017 |
| JP | 2019-220496 A | 12/2019 |
| KR | 10-2020-0050491 A | 5/2020 |
| KR | 10-2112368 B1 | 5/2020 |

OTHER PUBLICATIONS

International Search Report and Written Opinion dated Sep. 23, 2022 in International Patent Application No. PCT/US2022/029165, 11 pages.

* cited by examiner

*Primary Examiner* — Douglas W Owens
(74) *Attorney, Agent, or Firm* — Kilpatrick Townsend & Stockton LLP

(57) ABSTRACT

Exemplary substrate support assemblies may include an electrostatic chuck body that defines a substrate support surface. The substrate support surface may define a plurality of protrusions that extend upward from the substrate support surface. A density of the plurality of protrusions within an outer region of the substrate support surface may be greater than in an inner region of the substrate support surface. The substrate support assemblies may include a support stem coupled with the electrostatic chuck body. The substrate support assemblies may include an electrode embedded within the electrostatic chuck body.

17 Claims, 7 Drawing Sheets

LOW IMPEDANCE CURRENT PATH FOR EDGE NON-UNIFORMITY TUNING

TECHNICAL FIELD

The present technology relates to components and apparatuses for semiconductor manufacturing. More specifically, the present technology relates to substrate support assemblies and other semiconductor processing equipment.

BACKGROUND

Integrated circuits are made possible by processes which produce intricately patterned material layers on substrate surfaces. Producing patterned material on a substrate requires controlled methods for forming and removing material. Chamber components often deliver processing gases to a substrate for depositing films or removing materials. The discontinuity of a wafer edge may result in the deposition of these gases a bevel of the wafer, which may have a large impact on yield as the far edge film thickness variation affects a large number of device dies at the wafer edge.

Thus, there is a need for improved systems and methods that can be used to produce high quality devices and structures. These and other needs are addressed by the present technology.

SUMMARY

Exemplary substrate support assemblies may include an electrostatic chuck body that defines a substrate support surface. The substrate support surface may define a plurality of protrusions that extend upward from the substrate support surface. A density of the plurality of protrusions within an outer region of the substrate support surface may be greater than in an inner region of the substrate support surface. The substrate support assemblies may include a support stem coupled with the electrostatic chuck body. The substrate support assemblies may include an electrode embedded within the electrostatic chuck body.

In some embodiments, each of the plurality of protrusions may include a generally flat top surface. Each of the plurality of protrusions may have a diameter of between about 0.5 mm and 3 mm. The plurality of protrusions may be arranged in a plurality of concentric annular rings about the substrate support surface. The density of the plurality of protrusions within the inner region may be between about 1 and 8 protrusions per square inch. The density of the plurality of protrusions within the outer region may be between about 8 and 20 protrusions per square inch. The inner region may extend to at least about 60% of a radial distance from a center of the substrate support surface to a peripheral edge of the substrate support surface. The outer region may extend at least about 20% of a radial distance from a peripheral edge of the substrate support surface to a center of the substrate support surface. Top edges of each of the plurality of protrusions may be rounded. Each of the plurality of protrusions may be generally conical frustum shaped. A spacing between adjacent ones of the plurality of protrusions may be substantially constant within the outer region.

Some embodiments of the present technology may encompass substrate support assemblies. The substrate support assemblies may include an electrostatic chuck body defining a substrate support surface. The substrate support surface may define a plurality of protrusions that extend upward from the substrate support surface. A first region of the substrate support surface may include a first density of the plurality of protrusions. A second region of the substrate support surface comprises a second density of the plurality of protrusions that is higher than the first density. The substrate support assemblies may include a support stem coupled with the electrostatic chuck body. The substrate support assemblies may include an electrode embedded within the electrostatic chuck body.

In some embodiments, the second region may include an arc-shaped portion of the substrate support surface. The second region may include an annular section near an outer periphery of the substrate support surface. The plurality of protrusions may include a first plurality of protrusions that are arranged in a substantially uniform manner within the first region and a second plurality of protrusions that are arranged in a substantially uniform manner within the second region. The first density may be between about 1 and 8 protrusions per square inch. The second density may be between about 8 and 20 protrusions per square inch. Each of the plurality of protrusions may have a generally cylindrical shape. The substrate support surface may include a third region having a third density of the plurality of protrusions that is different than the first density and the second density.

Some embodiments of the present technology may encompass methods of processing a semiconductor substrate. The methods may include clamping a semiconductor substrate to a substrate support surface of an electrostatic chuck using a chucking voltage. The substrate support surface may define a plurality of protrusions that extend upward from the substrate support surface. A first region of the substrate support surface may include a first density of the plurality of protrusions. A second region of the substrate support surface may include a second density of the plurality of protrusions that is higher than the first density. The methods may include performing one or more deposition operations on the semiconductor substrate.

In some embodiments, the methods may include adjusting the chucking voltage to change an electric field in the second region based on a desired film thickness profile. The second region may include at least a portion of an annular ring within an outer region of the substrate support surface.

Such technology may provide numerous benefits over conventional systems and techniques. For example, embodiments of the present technology may provide substrate support assemblies that may increase deposition at the edge regions of a substrate relative to conventional technologies. The increased film thickness at the edge regions may be particularly useful for substrates that later undergo etching operations that etch or otherwise remove film at the edge regions at higher rates than in the inner region of the substrate. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
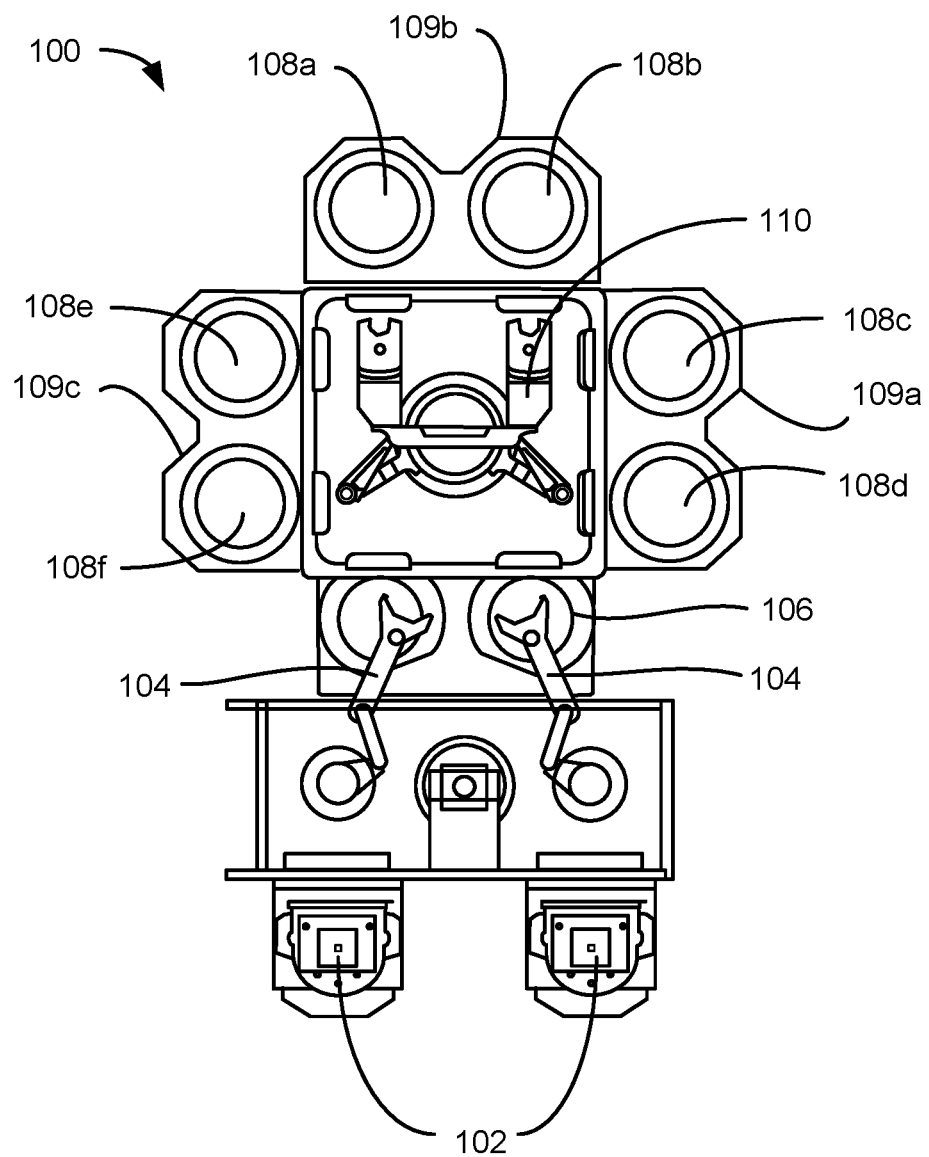
FIG. 1 shows a top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION OF THE INVENTION

Plasma enhanced deposition processes may energize one or more constituent precursors to facilitate film formation on a substrate. Any number of material films may be produced to develop semiconductor structures, including conductive and dielectric films, as well as films to facilitate transfer and removal of materials. For example, hardmask films may be formed to facilitate patterning of a substrate, while protecting the underlying materials to be otherwise maintained. In many processing chambers, a number of precursors may be mixed in a gas panel and delivered to a processing region of a chamber where a substrate may be disposed. While components of the lid stack may impact flow distribution into the processing chamber, many other process variables may similarly impact uniformity of deposition.

As device features reduce in size, tolerances across a substrate surface may be reduced, and material property differences across a film may affect device realization and uniformity. Many chambers include a characteristic process signature, which may produce residual non-uniformity across a substrate. Temperature differences, flow pattern uniformity, and other aspects of processing may impact the films on the substrate, creating film uniformity differences across the substrate for materials produced or removed. For example, turbulent deposition gas flow and/or misalignment of apertures of a blocker plate and faceplate of a gas box may lead to non-uniform flow of deposition gases. In some instances, the blocker plate may not uniformly distribute flow of precursors to edge regions of a substrate. Oftentimes, this may lead to a lower film thickness at the edge regions of the substrate. Additionally, in some embodiments a substrate support or heater on which a substrate is disposed may include one or more heating mechanisms to heat a substrate. When heat is delivered or lost differently between regions of a substrate, the film deposition may be impacted where, for example, warmer portions of the substrate may be characterized by thicker deposition or different film properties relative to cooler portions. This temperature non-uniformity may be attributable, for example, to temperature fluctuations about the shaft of the pedestal and may particularly affect edge regions of substrates, which may often have a lower film thickness.

In some embodiments, after completion of deposition operations the substrates may undergo one or more additional processing operations. For example, a substrate may undergo one or more mechanical polishing and/or etching operations. Oftentimes, these operations may have a higher etch/removal rate at the edge regions of the substrate than at the center, which may result in film thickness uniformity issues across the substrate.

The present technology overcomes these challenges with substrate support assemblies that create a low impedance current path at various areas of a substrate (such as at the edge regions) in which a higher film thickness is desired. In particular, embodiments may utilize a high density of protrusions extending upward from a support surface of the substrate support assembly to alter the concentration and distribution of an electric field across the support surface to impact the deposition rate. Areas having a high density of protrusions may be used to increase film thickness at corresponding areas of the substrate, which may be used to create a uniform film thickness across the substrate. In some instances, the film thickness at the edge regions may be altered to be higher than a film thickness within a center of the substrate prior to performing polishing and/or etching operations that may have greater etch rates at the edges of the substrate. Such an arrangement may create a substrate with a more uniform film thickness profile after the polishing and/or etching operations.

Although the remaining disclosure will routinely identify specific deposition processes utilizing the disclosed technology, it will be readily understood that the systems and methods are equally applicable to other deposition and cleaning chambers, as well as processes as may occur in the described chambers. Accordingly, the technology should not be considered to be so limited as for use with these specific deposition processes or chambers alone. The disclosure will discuss one possible system and chamber that may include pedestals according to embodiments of the present technology before additional variations and adjustments to this system according to embodiments of the present technology are described.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108*a-f*, positioned in tandem sections 109*a-c*. A second robotic arm 110 may be used to transport the substrate wafers from the holding area 106 to the substrate processing chambers 108*a-f* and back. Each substrate processing chamber 108*a-f*, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108a-f may include one or more system components for depositing, annealing, curing and/or etching a dielectric or other film on the substrate. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
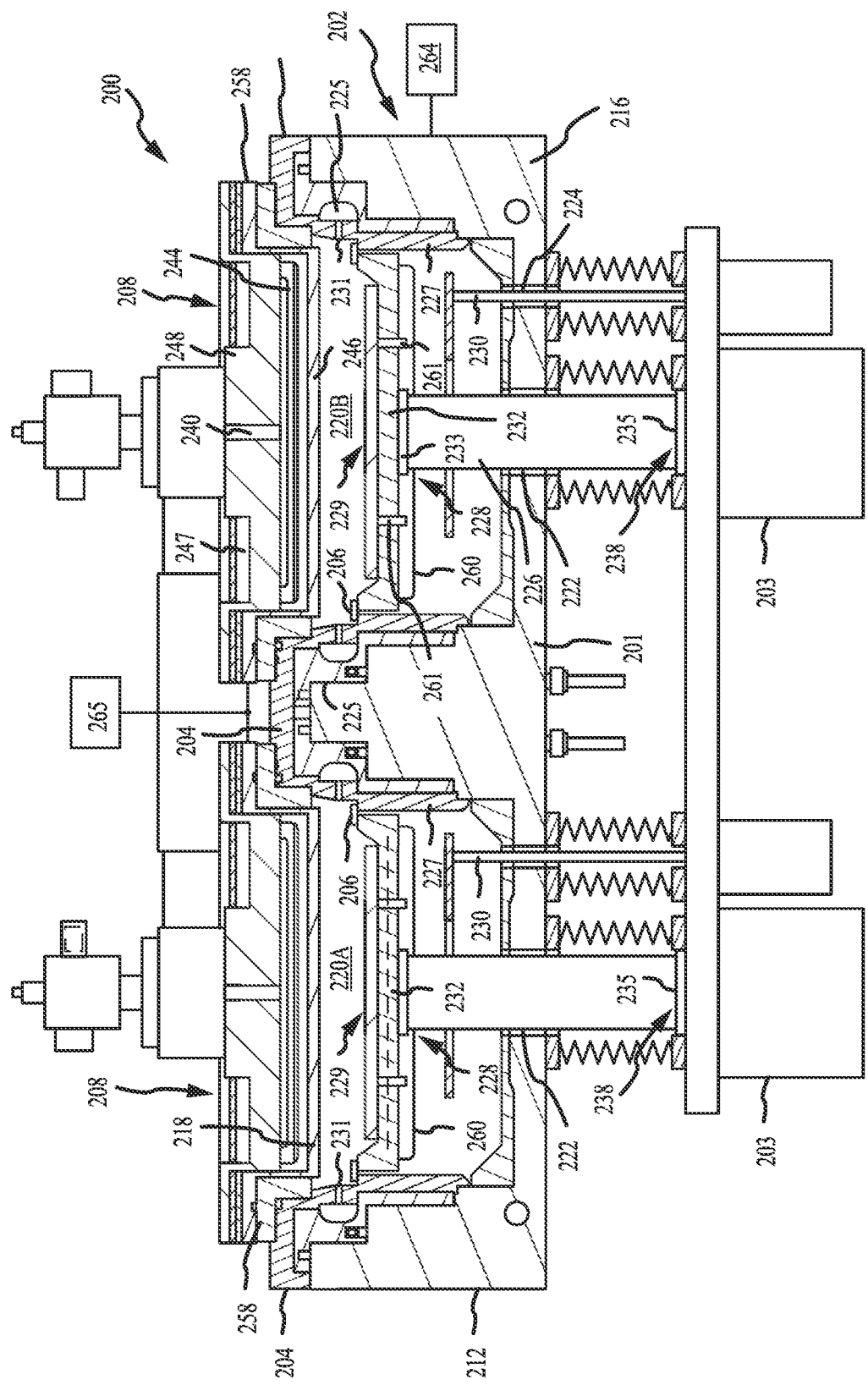
FIG. 2 shows a schematic cross-sectional view of an exemplary plasma system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include substrate support assemblies according to embodiments of the present technology. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a dual-channel showerhead 218 into the processing region 220B. The dual-channel showerhead 218 may include an annular base plate 248 having a blocker plate 244 disposed intermediate to a faceplate 246. A radio frequency ("RF") source 265 may be coupled with the dual-channel showerhead 218, which may power the dual-channel showerhead 218 to facilitate generating a plasma region between the faceplate 246 of the dual-channel showerhead 218 and the pedestal 228. In some embodiments, the RF source may be coupled with other portions of the chamber body 202, such as the pedestal 228, to facilitate plasma generation. A dielectric isolator 258 may be disposed between the lid 204 and the dual-channel showerhead 218 to prevent conducting RF power to the lid 204. A shadow ring 206 may be disposed on the periphery of the pedestal 228 that engages the pedestal 228.

An optional cooling channel 247 may be formed in the annular base plate 248 of the gas distribution system 208 to cool the annular base plate 248 during operation. A heat transfer fluid, such as water, ethylene glycol, a gas, or the like, may be circulated through the cooling channel 247 such that the base plate 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
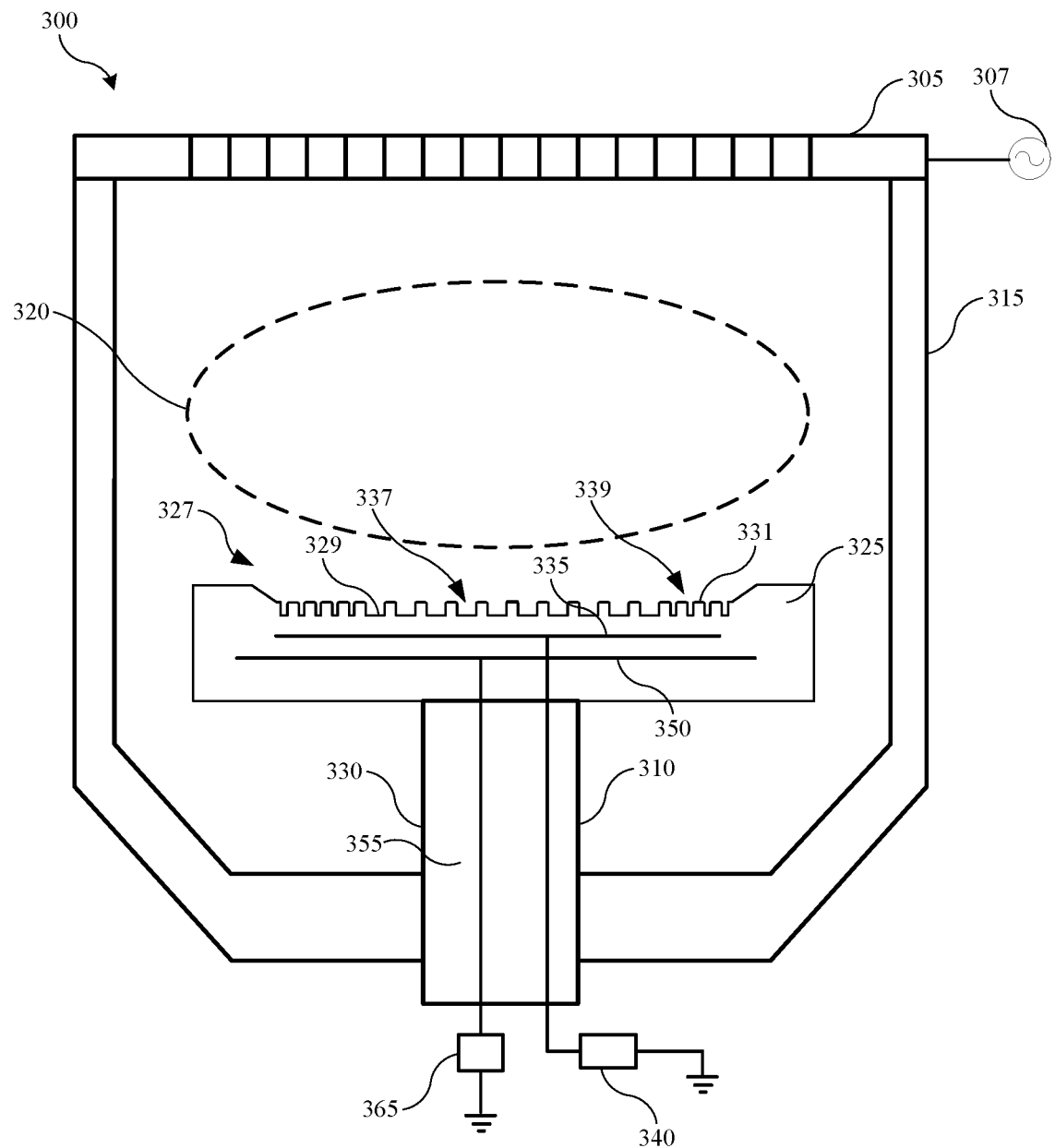
FIG. 3 shows a schematic partial cross-sectional view of an exemplary substrate support assembly according to some embodiments of the present technology.

FIG. 3 shows a schematic partial cross-sectional view of an exemplary semiconductor processing chamber 300 according to some embodiments of the present technology. FIG. 3 may include one or more components discussed above with regard to FIG. 2, and may illustrate further details relating to that chamber. The chamber 300 may be used to perform semiconductor processing operations including deposition of stacks of dielectric materials as previously described. Chamber 300 may show a partial view of a processing region of a semiconductor processing system, and may not include all of the components, such as additional lid stack components previously described, which are understood to be incorporated in some embodiments of chamber 300.

As noted, FIG. 3 may illustrate a portion of a processing chamber 300. The chamber 300 may include a showerhead 305, as well as a substrate support assembly 310. Along with chamber sidewalls 315, the showerhead 305 and the substrate support 310 may define a substrate processing region 320 in which plasma may be generated. The substrate support assembly may include an electrostatic chuck body 325, which may include one or more components embedded or disposed within the body. The components incorporated within the top puck may not be exposed to processing materials in some embodiments, and may be fully retained within the chuck body 325. Electrostatic chuck body 325 may define a substrate platform 327 having an substrate support surface 329, and may be characterized by a thickness and length or diameter depending on the specific geometry of the chuck body 325. In some embodiments, the substrate support surface 329 may be recessed relative to a top surface of the substrate platform 327. In some embodiments the chuck body may be elliptical, and may be characterized by one or more radial dimensions from a central axis through the chuck body 325. It is to be understood that the top puck may be any geometry, and when radial dimensions are discussed, they may define any length from a central position of the chuck body 325.

Electrostatic chuck body 325 may be coupled with a stem 330, which may support the chuck body 325 and may include channels as will be discussed below for delivering and receiving electrical and/or fluid lines that may couple with internal components of the chuck body 325. Chuck body 325 may include associated channels or components to operate as an electrostatic chuck, although in some embodiments the assembly may operate as or include components for a vacuum chuck, or any other type of chucking system. Stem 330 may be coupled with the chuck body on a second surface of the chuck body opposite the substrate support surface. The electrostatic chuck body 325 may include an electrode 335, which may be a DC electrode, embedded within the chuck body proximate the substrate support surface. Electrode 335 may be electrically coupled with a power source 340. Power source 340 may be configured to provide energy or voltage to the electrically conductive chuck electrode 335. This may be operated to form a plasma of a precursor within the processing region 320 of the semiconductor processing chamber 300, although other plasma operations may similarly be sustained. For example, electrode 335 may also be a chucking mesh that operates as electrical ground for a capacitive plasma system including an RF source 307 electrically coupled with showerhead 305. For example, electrode 335 may operate as a ground path for RF power from the RF source 307, while also operating as an electric bias to the substrate to provide electrostatic clamping of the substrate to the substrate platform 327. Power source 340 may include a filter, a power supply, and a number of other electrical components configured to provide a chucking voltage.

In operation, a substrate may be in at least partial contact with the substrate platform 327 of the electrostatic chuck body. This may produce a contact gap, which may essentially produce a capacitive effect between a surface of the pedestal and the substrate. Voltage may be applied to the contact gap, which may generate an electrostatic force for chucking. The power supply 340 may provide electric charge that migrates from the electrode to the substrate support surface 329 where it may accumulate, and which may produce a charge layer having Coulomb attraction with opposite charges at the substrate, and which may electrostatically hold the substrate against the substrate platform 327 of the chuck body 325. This charge migration may occur by current flowing through a dielectric material of the chuck body 325 based on a finite resistance within the dielectric for Johnsen-Rahbek type chucking, which may be used in some embodiments of the present technology.

The substrate platform 327 may include a number of protrusions 331 that are disposed within and protrude upward from the substrate support surface 329. The protrusions 331 may be used to support an underside of a substrate at various locations. The substrate support surface 329 may be divided into one or more regions, some or all of which may include different densities of protrusions 331. For example, as illustrated, the substrate support surface 329 may include a circular inner region 337 and an annular outer region 339 that is positioned outward of the inner region 337. The outer region 339 may have a larger density of protrusions 331 than the inner region 337, which may affect the film thickness within the outer region 339. For example, when voltage is supplied to the electrode 335, an electric field from the chucking voltage concentrates on each protrusion 331. By increasing the density of protrusions in a given area, the electric field in that area may also be increased, which lowers the impedance in such areas. The reduced impedance may increase the electron density and plasma generation proximate the higher electric field, which may lead to a higher film deposition rate at regions of the substrate support surface 329 in such areas (i.e., areas of the substrate support surface that have a higher density of protrusions 331). The magnitude of the electric field may be controlled by adjusting the chucking voltage. This may enable the chucking voltage to be used as a tuning knob to control film thickness in areas of high protrusion density without altering the film thickness is area of low protrusion density. For example, the chucking voltage may have a linear relationship with film thickness. In one particular embodiment, each volt (or fraction thereof) of chucking voltage may correspond to a set change in film thickness (such as 10 angstroms/volt) in areas of high protrusion density. Thus, by raising or lowering the chucking voltage, film thickness may be tailored in one or more regions of the substrate support surface.

In some embodiments the electrostatic chuck body 325 and/or the stem 330 may be insulative or dielectric materials. For example, oxides, nitrides, carbides, and other materials may be used to form the components. Exemplary materials may include ceramics, including aluminum oxide, aluminum nitride, silicon carbide, tungsten carbide, and any other metal or transition metal oxide, nitride, carbide, boride, or titanate, as well as combinations of these materials and other insulative or dielectric materials. Different grades of ceramic materials may be used to provide composites configured to operate at particular temperature ranges, and thus different ceramic grades of similar materials may be used for the top puck and stem in some embodiments. Dopants may be incorporated in some embodiments to adjust electrical properties as will be explained further below. Exemplary dopant materials may include yttrium, magnesium, silicon, iron, calcium, chromium, sodium, nickel, copper, zinc, or any number of other elements known to be incorporated within a ceramic or dielectric material.

Electrostatic chuck body 325 may also include an embedded heater 350 contained within the chuck body 325. Heater 350 may include a resistive heater or a fluid heater in embodiments. In some embodiments the electrode 335 may be operated as the heater, but by decoupling these operations, more individual control may be afforded, and extended heater coverage may be provided while limiting the region for plasma formation. Heater 350 may include a polymer heater bonded or coupled with the chuck body material, although a conductive element may be embedded within the electrostatic chuck body and configured to receive current, such as AC current, to heat the top puck. The current may be delivered through the stem 330 through a similar channel as the DC power discussed above. Heater 350 may be coupled with a power supply 365, which may provide current to a resistive heating element to facilitate heating of the associated chuck body 325 and/or substrate. Heater 350 may include multiple heaters in embodiments, and each heater may be associated with a zone of the chuck body, and thus exemplary chuck bodies may include a similar number or greater number of zones than heaters. The chucking mesh electrode 335 may be positioned between the heater 350 and the substrate platform 327 in some embodiments, and a distance may be maintained between the electrode within the chuck body 325 and the substrate platform 327 in some embodiments as will be described further below.

The heater 350 may be capable of adjusting temperatures across the electrostatic chuck body 325, as well as a substrate residing on the substrate platform 327. The heater may have a range of operating temperatures to heat the chuck body 325 and/or a substrate above or about 100° C., and the heater may be configured to heat above or about 125° C., above or about 150° C., above or about 175° C., above or about 200° C., above or about 250° C., above or about 300° C., above or about 350° C., above or about 400° C., above or about 450° C., above or about 500° C., above or about 550° C., above or about 600° C., above or about 650° C., above or about 700° C., above or about 750° C., above or about 800° C., above or about 850° C., above or about 900° C., above or about 950° C., above or about 1000° C., or higher. The heater may also be configured to operate in any range encompassed between any two of these stated numbers, or smaller ranges encompassed within any of these ranges. In some embodiments, as will be described further below, the chuck heater may be operated to maintain a substrate temperature above at least 500° C. during deposition operations, such as forming stacks of material for memory devices as previously described.

Figure 4A:
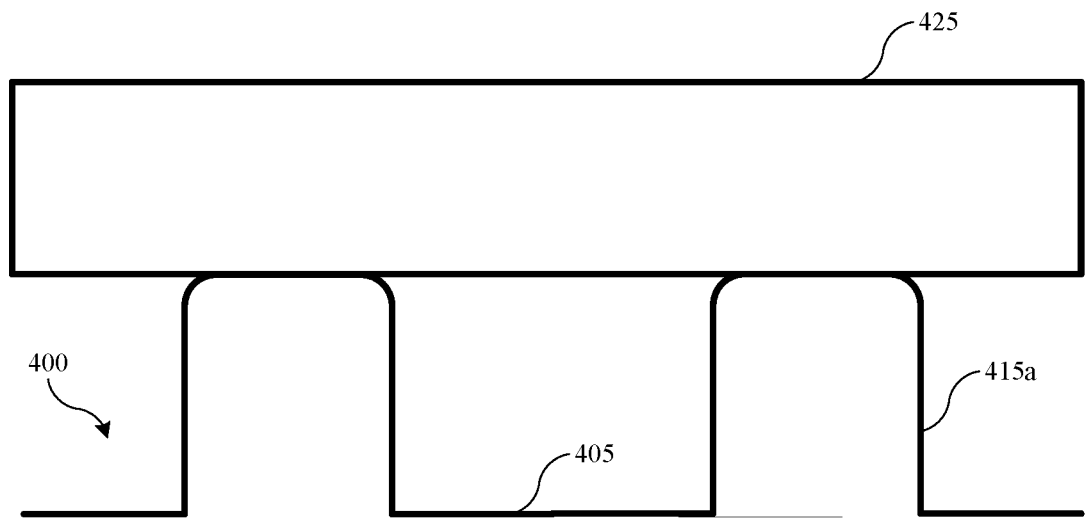
FIG. 4A shows a schematic side cross-sectional view of an exemplary substrate platform according to some embodiments of the present technology.
Figure 4B:
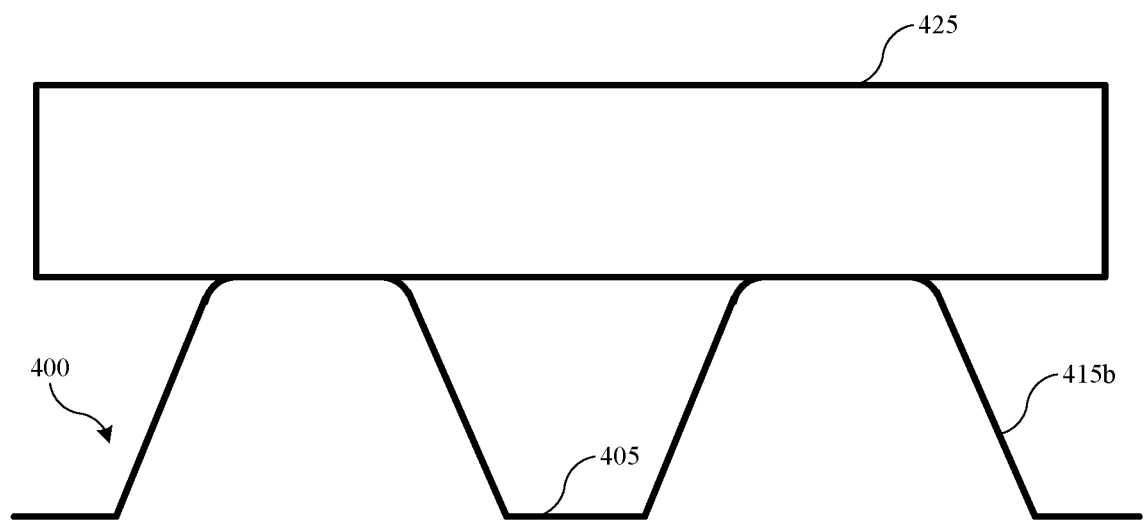
FIG. 4B shows a schematic side cross-sectional view of an exemplary substrate platform according to some embodiments of the present technology.

FIGS. 4A and 4B illustrate a schematic side cross-sectional view of an exemplary substrate support assembly 400 according to some embodiments of the present technology. Substrate support assembly 400 may include any of the components previously described and may illustrate additional details of substrate support assemblies previously described. Substrate support assembly 400 may be included in any chamber or system previously described (such as system 200 or chamber 300), as well as any other chamber or system. As illustrated, the figure may show a detailed view of an electrostatic chuck body 405, and more specifically a substrate support surface 410. The substrate support surface 410 may define a number of protrusions 415, which may extend upward from the substrate support surface 410. Each protrusion 415 may have a generally flat top surface for supporting a substrate 425. The protrusions 415 may be characterized by any number of geometries and profiles in embodiments of the present technology. In some embodiments, the protrusions 415 may have circular cross-sections. For example, as shown in FIG. 4A, protrusions 415a may have a generally cylindrical shape. In other embodiments, such as shown in FIG. 4B, protrusions 415b may have a generally conical frustum shape. It will be appreciated that other shapes of protrusions may be used in various embodiments.

Each protrusion 415 may be characterized by a diameter or width between about 0.5 mm and 3 mm. For example, each protrusion 415 may have a diameter or width of greater than or about 0.5 mm, greater than or about 1 mm, greater than or about 1.5 mm, greater than or about 2 mm, or more. Substrate support surface 410 may, in some embodiments, include a combination of protrusions 415 of various diameters between about 0.5 mm and 3 mm. Each protrusion 415 may have a height of between or about 5 μm and 100 μm, between or about 15 μm and 80 μm, between or about 25 μm and 70 μm, between or about 35 μm and 60 μm, or between or about 45 μm and 50 μm.

Oftentimes, upper corners of each protrusion 415 may be rounded, which may reduce or limit the sharp contact between the edge of protrusions 331 and the substrate. By providing a rounded corner on protrusions 415, an edge interaction with the substrate may be reduced when a substrate begins deflecting, which may reduce or limit scratching on the backside of the substrate. The amount of rounding may vary depending on any number of characteristics of the protrusions 415 or substrate support, although in some embodiments the corner radius may be less than or about 30% of a height of the protrusion 415, and may be less than or about 25% of the height, less than or about 20% of the height, less than or about 18% of the height, less than or about 15% of the height, less than or about 14% of the height, less than or about 13% of the height, less than or about 12% of the height, less than or about 11% of the height, less than or about 10% of the height, less than or about 9% of the height, or less, although in some embodiments the corner radius may be greater than or about 5% to ensure a reduced edge of the protrusions 415 are contacting the substrate.

For example, for a 30 μm tall protrusions 415, the corner radius may be less than or about 10 μm, and may be less than or about 9 μm, less than or about 8 μm, less than or about 7 μm, less than or about 6 μm, less than or about 5 μm, less than or about 4 μm, less than or about 3 μm, less than or about 2 μm, or less, although in some embodiments the corner radius may be greater than or about 3 μm to ensure sufficient rounding to limit edge contact. It is to be understood that protrusions 415 encompassed by embodiments of the present technology may be characterized by any other height or diameter as discussed previously. By providing substrate support assemblies characterized by protrusions 415 characterized by a rounded edge profile, the present technology may afford reduced backside damage on processed substrates, which may limit fall-on particles and lithography defocus, as well as improve device yield.

Figure 5:
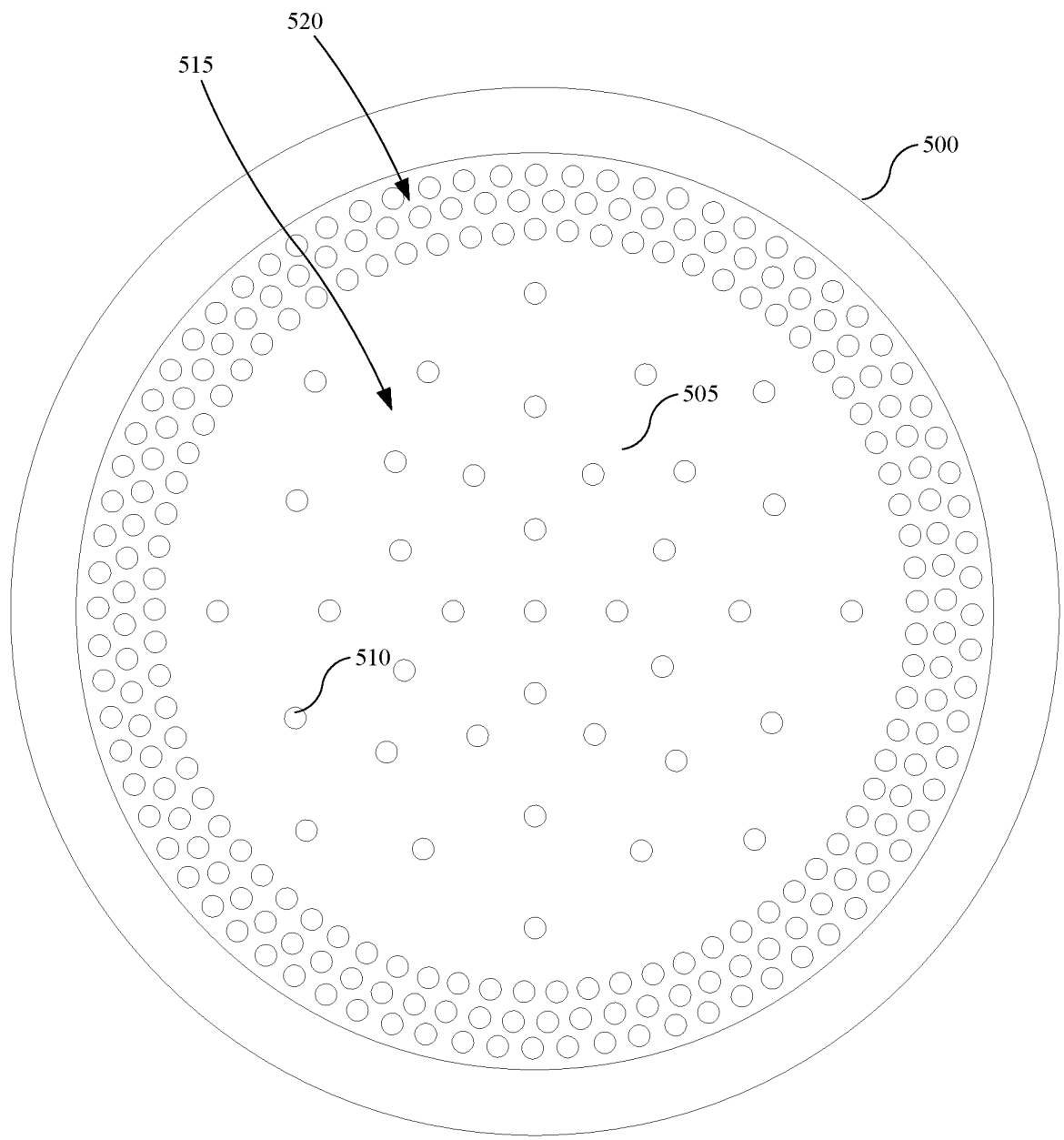
FIG. 5 shows a schematic partial top plan view of an exemplary substrate platform according to some embodiments of the present technology.

FIG. 5 shows a schematic top plan view of an exemplary substrate platform 500 according to some embodiments of the present technology. Substrate platform 500 may include any of the materials or components previously described, and may illustrate additional details of substrate platforms previously discussed. Substrate support assembly 500 may be included in any chamber or system previously described (such as system 200 or chamber 300), as well as any other chamber or system. As illustrated, substrate platform 500 may have substrate support surface 505. A number of protrusions 510 may be disposed within and protrude upward from the substrate support surface 505. As illustrated, the protrusions 510 may be arranged in a number of concentric annular rings from a center of the substrate support surface 505 towards an outer periphery of the substrate support surface 505, although other arrangements of protrusions 510 are possible in various embodiments.

The substrate support surface 505 may be divided into a number of regions, with at least some of the regions having different densities of protrusions 510. For example, as illustrated, the substrate support surface 505 is divided into two regions. A circular inner region 515 is provided that has a low density of protrusions 510. A low density of protrusions 510 may be greater than or about 1 and less than about 8 protrusions per square inch, between or about 1.5 and 7 protrusions per square inch, between or about 2 and 6 protrusions per square inch, between or about 2.5 and 5 protrusions per square inch, or between about 3 and 4 protrusions per square inch. An annular outer region 520 is positioned proximate a peripheral edge of the substrate support surface 505, with the outer region 520 having a high density of protrusions 510 relative to the inner region 515. A high density of protrusions 510 may be between or about 8 and 20 protrusions per square inch, between or about 9 and 19 protrusions per square inch, between or about 10 and 18 protrusions per square inch, between or about 11 and 17 protrusions per square inch, between or about 12 and 16 protrusions per square inch, between or about 13 and 15 protrusions per square inch, or about 14 protrusions per square inch. The substrate support surface 505 may define greater than or about 100 protrusions 510, greater than or about 200 protrusions 510, greater than or about 300 protrusions 510, greater than or about 400 protrusions 510, greater than or about 500 protrusions 510, greater than or about 750 protrusions 510, greater than or about 1000 protrusions 510, greater than or about 1250 protrusions 510, greater than or about 1500 protrusions 510, or more. The protrusions 510 may be defined in any number of formations or patterns, including uniform patterns as well as general distributions across the surface.

In some embodiments, the inner region 515 may extend outward from a center of the substrate support surface 505 to a position that is at least or about 60% of a radial distance from the center of the substrate support surface 505 to a peripheral edge of the substrate support surface 505, at least or about 65% of the radial distance, at least or about 70% of the radial distance, at least or about 75% of the radial distance, at least or about 80% of the radial distance, or greater. For example, for a 300 mm diameter substrate support surface 505, the inner region 515 may extend outward from the center by greater than or about 90 mm, greater than or about 95 mm, greater than or about 100 mm, greater than or about 105 mm, greater than or about 110 mm, greater than or about 115 mm, greater than or about 120 mm, or more. The outer region 520 may extend inward from the peripheral edge of the substrate support surface 505 to a position that is within or about 40% of a radial distance from the peripheral edge of the substrate support surface 505 to the center of the substrate support surface 505, within or about 35% of the radial distance, within or about 30% of the radial distance, within or about 25% of the radial distance, within or about 20% of the radial distance, within or about 15% of the radial distance, within or about 10% of the radial distance, within or about 5% of the radial distance, or less. For example, for a 300 mm diameter substrate support surface 505, the outer region 520 may extend inward from the peripheral edge of the substrate support surface 505 by less than or about 60 cm, less than or about 55 cm, less than or about 50 cm, less than or about 45 cm, less than or about 40 cm, less than or about 35 cm, less than or about 30 cm, or less.

The protrusions 510 within each region may be arranged in a uniform manner. For example, a distance between adjacent protrusions 510 within the outer region 520 may be substantially constant such that the density within the outer region 520 remains substantially uniform. Substantially constant distances between adjacent protrusions 510 may be distances that are within or about 15% of an average distance between adjacent protrusions within the region, within or about 10% of the average distance, within or about 5% of the average distance, within or about 3% of the average distance, within or about 1% of the average distance, or less. Similarly, a distance between adjacent protrusions 510 within the inner region 515 may be substantially constant such that the density within the inner region 515 remains substantially uniform. Oftentimes, protrusions 510 may be positioned at regular angular and/or radial distance intervals within a given region, however some embodiments may utilize irregular arrangements of protrusions 510.

Figure 6:
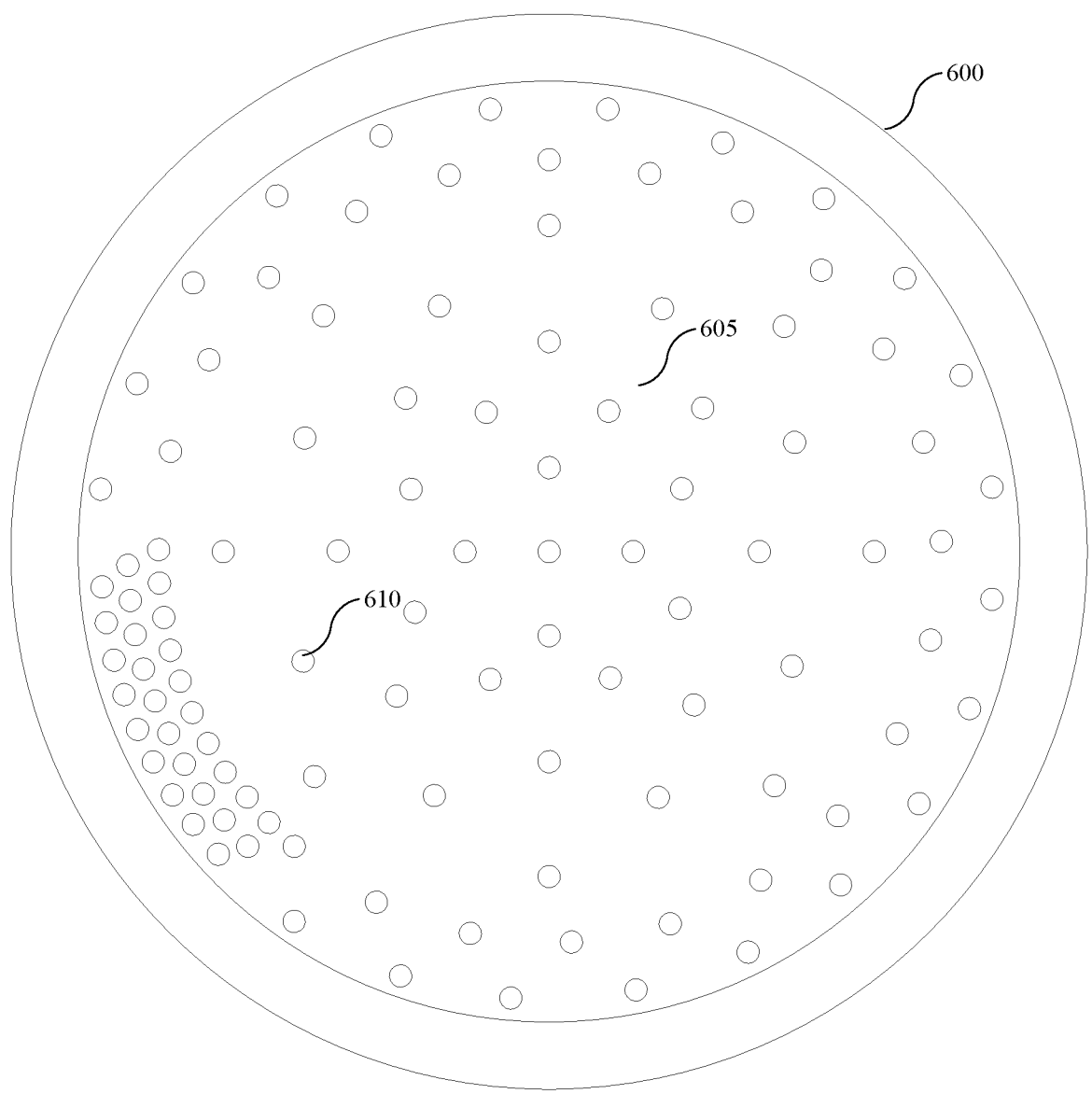
FIG. 6 shows a schematic partial top plan view of an exemplary substrate platform according to some embodiments of the present technology.

Substrate support surface 505 may include any number of regions. For example, the substrate support surface 505 may include greater than or about 2 regions, greater than or about 3 regions, greater than or about 4 regions, greater than or about 5 regions, greater than or about 6 regions, greater than or about 7 regions, greater than or about 8 regions, greater than or about 9 regions, greater than or about 10 regions, or more. In some embodiments, some or all of the regions may be approximately the same size and/or shape, while in other embodiments some or all of the regions may have different sizes and/or shapes. Some or all of the regions may have unique densities of protrusions 510, and some regions may be entirely devoid of protrusions 510. Additionally, while shown with a circular inner region and one or more annular regions outward of the inner region, it will be appreciated that other shapes of regions may be provided in various embodiments to achieve a desired film thickness profile. For example, FIG. 6 illustrates a schematic top plan view of an exemplary substrate platform 600 having an arc-shaped region according to some embodiments of the present technology. Substrate platform 600 may include any of the materials or components previously described, and may illustrate additional details of substrate platforms previously discussed. Substrate support assembly 600 may be included in any chamber or system previously described (such as system 200 or chamber 300), as well as any other chamber or system. As illustrated, substrate platform 600 may have substrate support surface 605 that defines a number of protrusions 610. As illustrated, an arc-shaped region of the substrate support surface 605 has a higher density of protrusions 610 than the rest of the substrate support surface 605, which has a lower, largely uniform density of protrusions 610. While shown with an arc-shaped region, it will be appreciated that any shape of region, including wedges, circles, and/or other shapes may be used in various embodiments. This may enable the ability to tune substrate film thickness in desired areas, with film deposition rates in areas of high protrusion density being altered by changes in chucking voltage. This may be particularly useful to combat non-uniformity issues caused by temperature gradients within a chamber, such as temperature changes due to the presence of a slit valve or other chamber access point.

It will be appreciated that the arrangement of regions described above are merely meant as examples and that numerous various arrangements of regions with different protrusion densities are possible. As just one example, a number of annular regions of varying protrusion density may be provided on a substrate support surface, which may enable the regions to serves as a radial tuning knob to adjust a film thickness profile across a surface of a substrate. Various other region arrangements may be provided to tune the film thickness profile in various embodiments.

By increasing the density of protrusions in a given area, the electric field in that area resulting from application of a chucking voltage may also be increased. The increased electric field may cause a corresponding change in the film deposition rate in such regions of the substrate support surface. This enables the chucking voltage to be adjusted to tune the film thickness in areas of high protrusion density, while leaving the film thickness unchanged in areas of low protrusion density. The chucking voltage may be used as a tuning knob to control film thickness in areas of high protrusion density, which may enable the film thickness profile of the substrate to be more carefully controlled for intended film thickness uniformity and/or non-uniformity.

Figure 7:
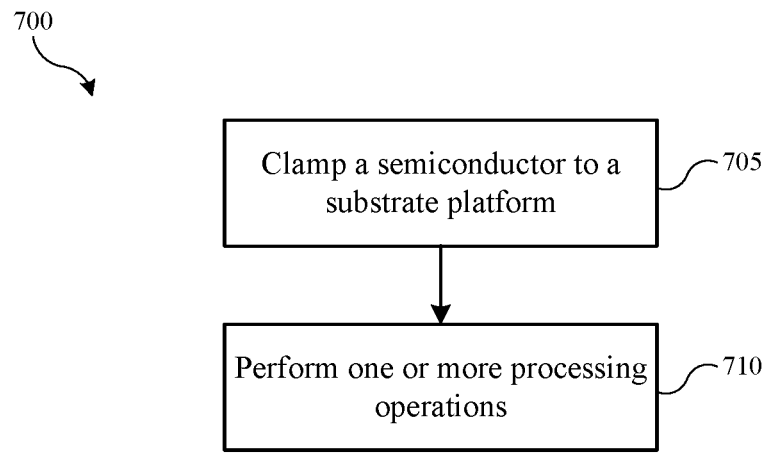
FIG. 7 is a flowchart of an exemplary method of semiconductor processing according to some embodiments of the present technology.

FIG. 7 shows operations of an exemplary method 700 of semiconductor processing according to some embodiments of the present technology. The method 700 may be performed in a variety of processing chambers, including processing system 200 and/or chamber 300 described above, which may include substrate platforms according to embodiments of the present technology, such as substrate platforms 325, 400, and 500, and 600. Method 700 may include a number of optional operations, which may or may not be specifically associated with some embodiments of methods according to the present technology.

Method 700 may include a processing method that may include operations for forming a hardmask film or other deposition operations. The method may include optional operations prior to initiation of method 700, or the method may include additional operations. For example, method 700 may include operations performed in different orders than illustrated. In some embodiments, method 700 may include clamping a semiconductor substrate to a substrate support surface of a substrate platform using a chucking voltage at operation 705. For example, a semiconductor substrate may be positioned atop a number of protrusions that extend upward from the substrate support surface. A first region of the substrate support surface may include a first density of protrusions, while a second region of the substrate support surface may include a second, higher density of protrusions. The second region may include an annular and/or arc-shaped section of the substrate support surface in some embodiments. The method 700 may include performing one or more film deposition operations on the substrate at operation 710. In some embodiments, the film deposition operations may include flowing one or more precursors into a processing chamber. For example, the precursor may be flowed into a chamber, such as included in system 100 or 200, or chamber 300, and may flow the precursor through one or more of a gasbox, a blocker plate, or a faceplate, prior to delivering the precursor into a processing region of the chamber. In some embodiments the precursor may be or include a carbon-containing precursor. A plasma may be generated of the precursors within the processing region, such as by providing RF power to the faceplate to generate a plasma. Material formed in the plasma, such as a carbon-containing material, may be deposited on the substrate.

Method 700 may include adjusting the chucking voltage to change an electric field in the second region based on a desired film thickness profile. The altered electric field may cause a corresponding adjustment to the film thickness within the second region. For example, increasing the chucking voltage may result in an increased deposition rate within the second region, while decreasing the chucking voltage may result in a decreased deposition rate within the second region. The chucking voltage and/or the arrangement of protrusions within one or more regions of the substrate support surface may be selected to generate a substrate having a desired film thickness profile. For example, in some embodiments, the chucking voltage and/or the arrangement of protrusions may be selected to generate a substrate with a substantially uniform film thickness across the surface of the substrate. In other embodiments, such as those in which the substrate is to be polished and/or etched, the chucking voltage and/or the arrangement of protrusions may be selected to generate a substrate with a desired non-uniform film thickness to account for non-uniform etch and/or other removal rates in subsequent processing operations.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a heater" includes a plurality of such heaters, and reference to "the protrusion" includes reference to one or more protrusions and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A substrate support assembly, comprising:
an electrostatic chuck body defining a substrate support surface, wherein:
  the substrate support surface defines a plurality of protrusions that extend upward from the substrate support surface; and
  a density of the plurality of protrusions within an outer region of the substrate support surface is greater than in an inner region of the substrate support surface;
a support stem coupled with the electrostatic chuck body; and
an electrode embedded within the electrostatic chuck body.

2. The substrate support assembly of claim 1, wherein:
each of the plurality of protrusions comprises a generally flat top surface.

3. The substrate support assembly of claim 1, wherein:
each of the plurality of protrusions has a diameter of between about 0.5 mm and 3 mm.

4. The substrate support assembly of claim 1, wherein:
the plurality of protrusions are arranged in a plurality of concentric annular rings about the substrate support surface.

5. The substrate support assembly of claim 1, wherein:
the density of the plurality of protrusions within the inner region is between about 1 and 8 protrusions per square inch; and
the density of the plurality of protrusions within the outer region is between about 8 and 20 protrusions per square inch.

6. The substrate support assembly of claim 1, wherein:
the inner region extends to at least about 60% of a radial distance from a center of the substrate support surface to a peripheral edge of the substrate support surface.

7. The substrate support assembly of claim 1, wherein:
the outer region extends at least about 20% of a radial distance from a peripheral edge of the substrate support surface to a center of the substrate support surface.

8. The substrate support assembly of claim 1, wherein:
top edges of each of the plurality of protrusions are rounded.

9. The substrate support assembly of claim 1, wherein:
each of the plurality of protrusions are generally conical frustum shaped.

10. The substrate support assembly of claim 1, wherein:
a spacing between adjacent ones of the plurality of protrusions is substantially constant within the outer region.

11. A substrate support assembly, comprising:
an electrostatic chuck body defining a substrate support surface, wherein:
the substrate support surface defines a plurality of protrusions that extend upward from the substrate support surface;
a first region of the substrate support surface comprises a first density of the plurality of protrusions; and
a second region of the substrate support surface comprises a second density of the plurality of protrusions that is higher than the first density;
a support stem coupled with the electrostatic chuck body; and
an electrode embedded within the electrostatic chuck body.

12. The substrate support assembly of claim 11, wherein:
the second region comprises an arc-shaped portion of the substrate support surface.

13. The substrate support assembly of claim 11, wherein:
the second region comprises an annular section near an outer periphery of the substrate support surface.

14. The substrate support assembly of claim 11, wherein:
the plurality of protrusions comprises a first plurality of protrusions that are arranged in a substantially uniform manner within the first region and a second plurality of protrusions that are arranged in a substantially uniform manner within the second region.

15. The substrate support assembly of claim 11, wherein:
the first density is between about 1 and 8 protrusions per square inch; and
the second density is between about 8 and 20 protrusions per square inch.

16. The substrate support assembly of claim 11, wherein:
each of the plurality of protrusions has a generally cylindrical shape.

17. The substrate support assembly of claim 11, wherein:
the substrate support surface comprises a third region comprising a third density of the plurality of protrusions that is different than the first density and the second density.

\* \* \* \* \*